(12) United States Patent
Lee

(10) Patent No.: US 6,631,556 B2
(45) Date of Patent: Oct. 14, 2003

(54) FIXTURE TO COUPLE AN INTEGRATED CIRCUIT TO A CIRCUIT BOARD

(75) Inventor: Ken K. Lee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 76 days.

(21) Appl. No.: 09/870,096

(22) Filed: May 30, 2001

(65) Prior Publication Data

US 2002/0178577 A1 Dec. 5, 2002

(51) Int. Cl.[7] .................................................. H05K 3/30
(52) U.S. Cl. .............................. 29/832; 29/830; 29/834; 29/837; 29/757; 269/903; 269/289 R
(58) Field of Search ........................ 29/830, 832, 834, 29/837, 760, 750, 757, 758; 269/903, 291, 289 R

(56) References Cited

U.S. PATENT DOCUMENTS

| | | | | |
|---|---|---|---|---|
| 4,149,311 A | * | 4/1979 | Benson et al. ................. 29/741 |
| 4,506,941 A | * | 3/1985 | Tustaniwskyj ............... 439/296 |
| 4,801,131 A | * | 1/1989 | Bagley .......................... 269/75 |
| 5,003,254 A | * | 3/1991 | Hunt et al. ................... 324/754 |
| 5,031,820 A | * | 7/1991 | Jacks et al. ................... 228/6.2 |
| 5,416,429 A | * | 5/1995 | McQuade et al. ........... 324/762 |
| 6,160,409 A | * | 12/2000 | Nurioka ....................... 324/754 |
| 6,202,293 B1 | * | 3/2001 | Schaller et al. ................ 29/760 |

* cited by examiner

Primary Examiner—Joseph J. Hail, III
Assistant Examiner—Alvin J Grant
(74) Attorney, Agent, or Firm—Schwegman, Lundberg, Woessner & Kluth, P.A.

(57) ABSTRACT

A fixture to couple an integrated circuit to a circuit board is disclosed and claimed. The fixture includes a base member and a holder to retain the circuit board in a selected position relative to the base member. A clamp assembly is included to hold a package containing the integrated circuit in a predetermined position on the circuit board and to cause electrical contact between the integrated circuit and the circuit board.

51 Claims, 2 Drawing Sheets

FIXTURE TO COUPLE AN INTEGRATED CIRCUIT TO A CIRCUIT BOARD

FIELD OF THE INVENTION

The present invention relates generally to integrated circuits (ICs), semiconductor chips or the like, and more particularly to a fixture to couple an IC, semiconductor chip or the like to a circuit board for testing or measuring signals and operating parameters associated with the IC or chip or for other purposes.

BACKGROUND INFORMATION

In testing and evaluating ICs or semiconductor chips, it is necessary to electrically connect the IC or chip to a printed circuit board or test platform to perform the tests and evaluations. For optimal electrical performance and to insure good electrical contact, the IC or chip is typically soldered to the circuit board or test platform and then desoldered after the evaluation process so that another IC to be tested can be soldered to the circuit board. This results in numerous soldering and desoldering operations that will eventually wear down the components and the test board or platform or damage the components or test board. Additionally, the integrity of the solder joints and the degree of wear and tear on contact pins on a chip and conductive pads or footprint on a circuit board are dependent upon the skill of the person doing the soldering and desoldering. Components can be damaged or worn out much sooner if care and skill are lacking in the process. Soldering and desoldering multiple pin connections for each IC being tested is also very tedious and time consuming.

In evaluating ICs or chips from various manufacturers, the same test set up for all ICs or chips is desirable so that there is a common basis for comparison and everything is equal. Accordingly, if a test board becomes damaged after repeated soldering and desoldering operations, a new board will need to be substituted to test the remaining chips and the test results could be influenced by the characteristics of the new board which could differ from the original board.

One alternative to soldering and desoldering is to install a socket on the test board. A socket, however, cannot be used with some designs because of the excess area occupied by the socket on the board. Additionally, a socket can introduce anomalies that adversely alter the characteristics of the board.

Accordingly, for the reason stated above, and for other reasons that will become apparent upon reading and understanding the present specification, there is a need for a fixture and method to couple an IC, semiconductor chip or the like to a circuit board or test platform that is efficient and non-damaging to the components.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1:
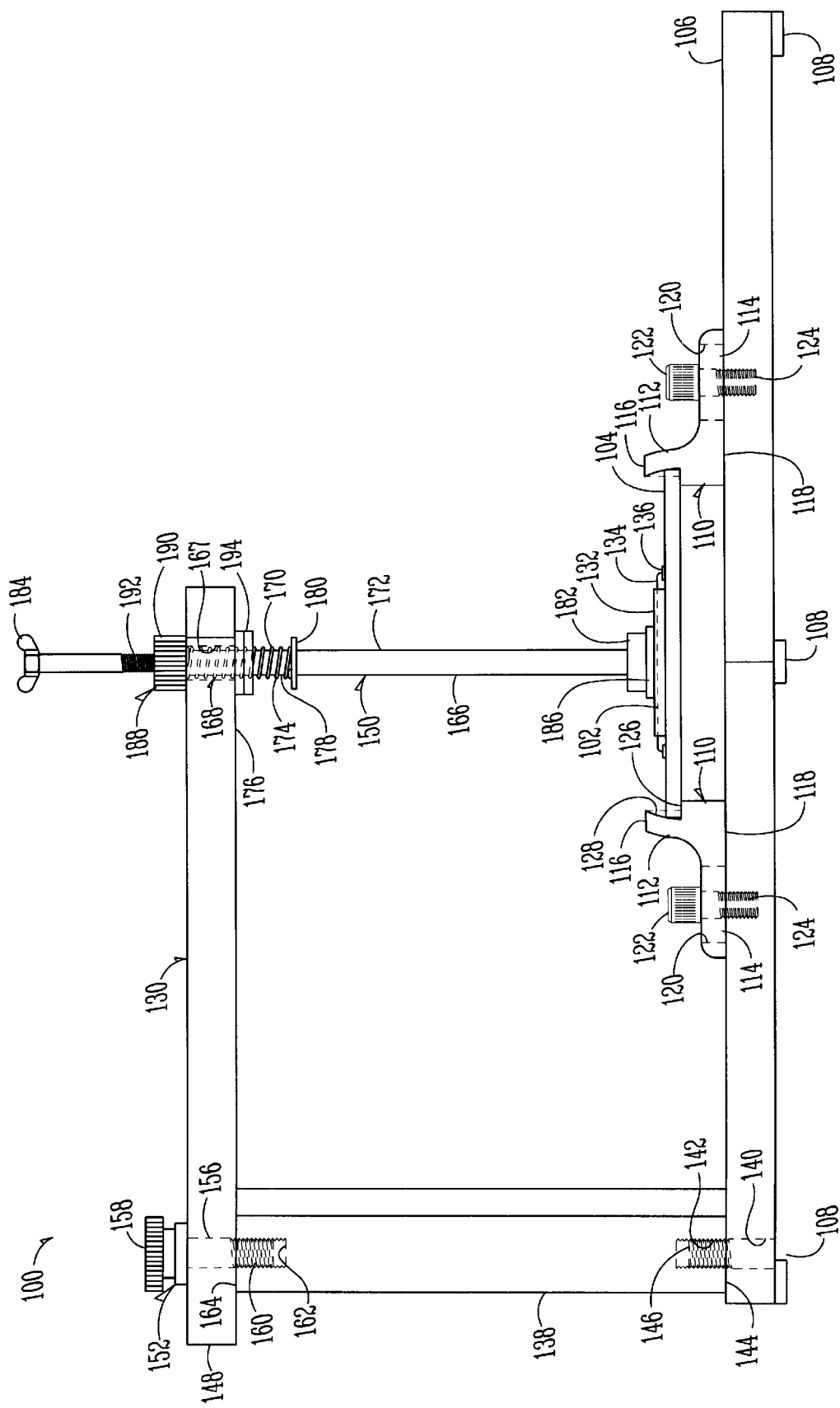
FIG. 1 is a side elevation view of a fixture to couple an IC, semiconductor chip or the like to a circuit board or test platform in accordance with the present invention.

Referring initially to FIG. 1, a side elevation view of a fixture 100 to couple an IC 102, semiconductor chip or the like to a circuit board 104 or test platform is shown. The fixture 100 includes a substantially planar base member 106. The base member 106 may be made from a metal material such as aluminum or the like or a hard plastic material. The base member 106 may be supported by a plurality of footers 108 made from a rubber type material to prevent the base member 106 from slipping on another surface (not shown) such as a table top or lab bench on which the fixture 100 is placed for use. The footers 108 will also dampen any vibrations that could cause the IC 102 to shift from a selected location on the circuit board 104.

Figure 2:
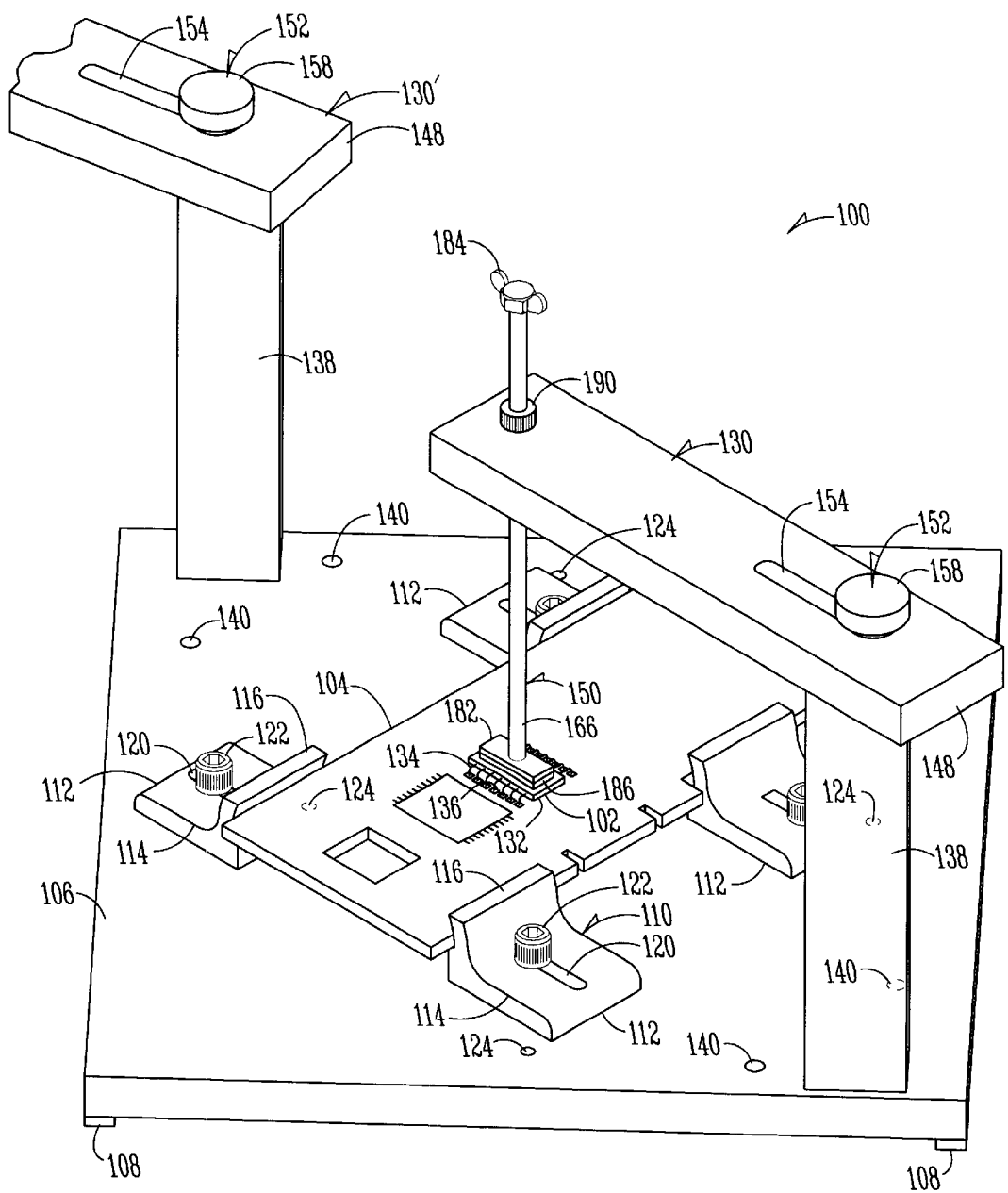
FIG. 2 is a perspective view of the fixture of FIG. 1.

The circuit board 104 is retained in a selected position relative to the base member by a holder 110. The holder 110 may be any suitable device that is adjustable to accommodate circuit boards 104 of varying dimensions and shapes and that can retain the circuit board 104 in a fixed position relative to the base member 106. Additionally, if the base member 106 is made from an electrically conductive material, the holder 110 should insulate or prevent the circuit board 104 from making electrical contact with the base member 106 that could short out the circuit board 104 and cause damage or erroneous test results. One example of a holder 110 shown in FIGS. 1 and 2 is a plurality of clips 112. As best shown in FIG. 1, the clips 112 include a lower substantially flat portion 114 and an upper portion 116 that holds or retains the circuit board 104. The lower flat portion 114 has a substantially planar bottom 118 that slidably contacts the surface of the base member 106. As best shown in FIG. 2, the lower flat portion 114 has an elongated slot 120 formed therein. A screw 122 is inserted through the slot 120 and is received into a matingly threaded opening 124 formed in the base member 106 (FIG. 1). The clips 112 may then be adjusted along their slots 120 to accommodate circuit boards 104 of different dimensions and shapes. Additionally, as shown in FIG. 2, a plurality of threaded openings 124 may be formed in the base member 106 at various locations to accommodate different sizes and shapes of circuit boards 104.

The upper portion 116 of the clip 112 includes a substantially flat horizontal ledge 126 on which only an edge of the circuit board 104 rests. The upper portion 116 of the clip 112 also includes a curved segment 128 that curves or slants upwardly and over at least part of the ledge 126. As best shown in FIG. 1, the circuit board 104 is then captured by its edges and held firmly in place when at least a pair of opposing clips 112 are pushed together with the circuit board 104 resting on the ledges 126 of the opposing clips 112. The screw 122 of each clip 112 can then be tightened to retain the clip 112 in position on the base member 106 with the circuit board 104 firmly held between the clips 112.

The fixture 100 also includes at least one clamp assembly 130 to hold or retain a package 132 containing the integrated circuit 102 in a predetermined position on the printed circuit board 104. The clamp assembly 130 will apply a clamping force against the package 132 to cause a plurality of contact pins 134 or terminals of the integrated circuit 102 to electrically contact a plurality of corresponding conductive pads 136 or conductive footprint formed on the circuit board 104. The clamp assembly 130 includes a riser 138 mounted to the base member 106. The riser 138 extends upright from the base member 106 and may extend substantially perpendicular to the base member 106. Referring to FIG. 2, a second plurality of holes 140 may be formed at selected locations in the base member 106 to permit the riser 138 to be attached to the base member 106 at different locations to accommodate circuit boards 104 of different dimensions and shapes and to permit flexibility in positioning the clamp assembly 130 to apply the clamping force to the integrated circuit package 132. The riser 138 has a threaded opening 142 formed in abase end 144 thereof (FIG. 1). A bolt 146 is inserted through a selected one of the plurality of holes 140 formed in the base member 106 and is received by the threaded opening 142 to securely attach the riser 138 to the base member 106 at a selected location.

A gantry 148 is mounted to the riser 138 and a plunger unit 150 is attached to the gantry 148 to apply the clamping force against the IC package 132 to cause the contact pins 134 of the integrated circuit 102 to electrically contact the corresponding conductive pads 136 on the circuit board 104. The gantry 148 may extend substantially perpendicular to the riser 138 and substantially parallel to the base member 106. The gantry 148 includes a gantry positioning element 152. The gantry positioning element 152 may be any arrangement that permits adjustability of the gantry 148 to facilitate precisely aligning the plunger unit 150 to uniformly apply the clamping force across the IC package 132 and thereby insure that electrically contact is maintained between each of the contact pins 134 and its corresponding conductive pad 136. As example of the gantry positioning element 152 the gantry 148 may have a slot 154 (FIG. 2) formed therein through which a stem 156 (FIG. 1) extends from a gantry positioning knob 158. The stem 156 has a threaded end 160 that is received by a matingly threaded opening 162 formed in a top end 164 of the riser 138. The gantry 148 is slidable along the slot 154 and rotatable about the stem 156 to position the plunger unit 150 at different selected locations radially and circumferentially about the riser 138. The positioning knob 158 is tightened to secure the plunger unit 150 at a selected location.

Another example of the gantry positioning element 152 would be to modify the gantry 148 to permit the plunger unit 150 to move and be positioned at different locations along the extent of the gantry 148.

The plunger unit 150 includes a shaft 166 extending through an opening 168 formed in the gantry 148 proximate to an end of the gantry 148 opposite to the slot 154. The plunger unit 150 further includes a biasing arrangement 168 coupled to the shaft 166 to cause the shaft 166 to apply the clamping force to the IC package 132. The shaft 166 may include a first segment 170 and second segment 172. In one embodiment of the present invention, the first segment 170 of the shaft 166 has a smaller diameter than the second segment 172, and the biasing arrangement 168 includes a coil spring 174 through which the first segment 170 of the shaft 166 is inserted. One end of the coil spring 174 will contact an underside 176 of the gantry 148 and an opposite end of the coil spring 174 will contact an edge 178 of the second segment 172 where the first segment 170 meets the second segment 172 of the shaft 166. The inner diameter of the coil spring 174 must, therefore, be large enough to insert the first segment 170 of the shaft 166 through the coil spring 174 and the outer diameter of the coil spring 174 must be small enough so that the spring 174 will not slip over the second segment 172. Accordingly, the coil spring 174 will push or bias the shaft 166 downwardly or away from the gantry 148 to apply the clamping force to the IC package 132.

In an alternate embodiment, the shaft 166 may be all one diameter and a stop 180 or the like may be attached to the shaft 166 at a location below the gantry 148. The shaft 166 is then disposed through the coil spring 174. The one end of the coil spring 174 will engage the gantry 148 and the opposite end of the coil spring 174 will engage or contact the stop 180 to push or bias the shaft 166 downwardly or away from the gantry 148 to apply the clamping force to the IC package 132.

A foot 182 is preferably attached or formed at one end of the shaft 166 to apply the clamping force to the IC package 132. The foot 182 is preferably about the same size and shape of the IC package 132 to substantially uniformly apply the clamping force along the extent of the IC package 132. Different sizes and shapes of feet 182 may be interchangeably attached to the shaft 166, or shafts 166 with different sizes and shapes of feet 182 may be formed and interchanged in the clamp assembly 130 to accommodate different dimensions and shapes of IC packages 132. A knob 184 may be attached or formed at an opposite end of the shaft 166 from the foot 182 to facilitate lifting and rotating the foot 182 to place the foot 182 in proper alignment with the IC package 132. A conformable pad 186 made from a rubber like material may be disposed between the foot 182 and the IC package 132 to facilitate in distributing the clamping force more uniformly over the extent of the IC package 132 so that electrical contact between the contact pins 134 of the IC 102 and the conductive pads 136 formed on the circuit board 104 will be more definite. The conformable pad 186 may be attached to the foot 182 by an adhesive. The conformable pad 186 may also be of different sizes and shapes to accommodate IC packages 132 of different sizes and shapes.

The fixture 100 is particularly useful in testing ICs under development or pre-production ICs. Pre-production ICs are manufactured as inexpensively as possible and the packaging typically consists of depositing a glop of passivation material, such as epoxy or the like, over the IC 102 to cover the IC 102 and close the open top of the IC package 132 or container. For this reason, these pre-production ICs are often referred to as "glop-tops." The surface of the glop-top can be very irregular. Accordingly, the conformable pad 186 serves to more uniformly distribute the clamping force on such IC packages 132.

An adjustment mechanism 188 is provided to adjust or select an amount of the clamping force to be applied to the IC package 132 by the plunger unit 150. The adjustment mechanism 188 may also be used to control a distance or height of the foot 182 or end of the shaft 166 from the base member 106 to preadjust the tension of the spring 174 before the circuit board 104 and IC 102 are positioned beneath the plunger unit 150. The adjustment mechanism 188 includes an adjustment fitting or knurled nut 190 mounted on the shaft 166 on a side of the gantry 148 opposite to the biasing arrangement 168 or spring 174. The knurled nut 190 has a threaded interior to be received by a threaded portion 192 of the shaft 166. The knurled nut 190 may be turned to position the nut 190 along the shaft 166 to adjust the tension on the biasing arrangement 168 or spring 174 to select or control the amount of the clamping force applied by the spring 174. The adjustment mechanism 188 may also include one or more spacers 194 to adjust the tension on the spring 174. The spacers 194 may be disposed on the shaft 166 between the spring 174 and the gantry 148. The adjustment mechanism 188 may also include selecting the spring 174 to have a predetermined spring constant to select the amount of the clamping force to be applied to the IC package 132.

As shown in FIG. 2, the fixture 100 may include at least a second clamp assembly 130'. The second clamp assembly 130' may be used to retain a second IC package (not shown) in a predetermined position on the circuit board 104 or the second clamp assembly 130' may be used because the circuit board shape and dimensions or the placement of the IC package 132 may require that the second clamp assembly 130' be used rather than the first clamp assembly 130. The components of the second clamp assembly 130' may also have different dimensions or configuration to handle different board designs and IC placements.

While the clamp assembly 130 of the present invention has been described as comprising separate components including the riser 138, the gantry 148 and the plunger unit 150, alternate structural components could be utilized or may be suggested by the preceding description. For example, the riser 130 and gantry 148 may be formed as an integral unit, or as previously described, the plunger unit 150 may be disposed in a slot formed through the gantry 148 or other equivalent structure may be used to facilitate aligning the plunger unit 150 with the IC package 132.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is intended that this invention be limited only by the claims and the equivalents thereof.

What is claimed is:

1. A fixture, comprising:
   a base member;
   a holder to retain a circuit board in a selected position relative to the base member; and
   a clamp assembly to hold a package containing an integrated circuit in a predetermined position on the circuit board and to cause electrical contact between the integrated circuit and the circuit board, wherein the clamp assembly comprises:
      a riser mounted to the base member;
      a gantry mounted to the riser; and
      a plunger unit mounted to the gantry to apply a force against the package to cause a plurality of contact pins of the integrated circuit to electrically contact corresponding conductive pads formed on the circuit board, wherein the plunger unit comprises:
         a shaft extending through an opening formed in the gantry; and
         a biasing arrangement coupled to the shaft to apply the force to the package,
         wherein the shaft comprises a first segment and a second segment, the first segment having a smaller diameter than the second segment and wherein the biasing arrangement comprises a coil spring through which the first segment of the shaft is disposed with one end of the coil spring being in contact with the gantry and an opposite end of the coil spring being in contact with an edge of the second segment of the shaft.

2. A fixture, comprising:
   a base member;
   a holder to retain a circuit board in a selected position relative to the base member; and
   a clamp assembly to hold a package containing an integrated circuit in a predetermined position on the circuit board and to cause electrical contact between the integrated circuit and the circuit board, wherein the clamp assembly comprises:
      a riser mounted to the base member;
      a gantry mounted to the riser; and
      a plunger unit mounted to the gantry to apply a force against the package to cause a plurality of contact pins of the integrated circuit to electrically contact corresponding conductive pads formed on the circuit board, wherein the plunger unit comprises:
         a shaft extending through an opening formed in the gantry;
         a biasing arrangement coupled to the shaft to apply the force to the package; and
         a stop attached to the shaft,
         wherein the biasing arrangement comprises a coil spring through which the shaft is disposed with one end of the coil spring in contact with the gantry and an opposite end of the coil spring in contact with the stop.

3. A fixture, comprising:
   a base member;
   a holder to retain a circuit board in a selected position relative to the base member; and
   a clamp assembly to hold a package containing an integrated circuit in a predetermined position on the circuit board and to cause electrical contact between the integrated circuit and the circuit board, wherein the clamp assembly comprises:
      a riser mounted to the base member;
      a gantry mounted to the riser; and
      a plunger unit mounted to the gantry to apply a force against the package to cause a plurality of contact pins of the integrated circuit to electrically contact corresponding conductive pads formed on the circuit board, wherein the plunger unit comprises:
         a shaft extending through an opening formed in the gantry;
         a biasing arrangement coupled to the shaft to apply the force to the package; and
         an adjustment mechanism to control a distance of an end of the shaft that contacts the package from the base member and to select an amount of the force to be applied to the package by the plunger unit.

4. The fixture of claim 3, wherein the adjustment mechanism comprises an adjustment fitting mounted on the shaft on a side of the gantry opposite to the biasing arrangement, the adjustment fitting being positioned along the shaft to select the amount of the force applied by the biasing arrangement.

5. The fixture of claim 3, wherein the adjustment mechanism comprises at least one spacer coupled to the biasing arrangement to select the amount of the force to be applied to the package.

6. A fixture, comprising:
   a base member;
   a holder to retain a circuit board in a selected position relative to the base member; and
   a clamp assembly to hold a package containing an integrated circuit in a predetermined position on the circuit board and to cause electrical contact between the integrated circuit and the circuit board, wherein the clamp assembly comprises:
      a riser mounted to the base member;
      a gantry mounted to the riser; and
      a plunger unit mounted to the gantry to apply a force against the package to cause a plurality of contact pins of the integrated circuit to electrically contact corresponding conductive pads formed on the circuit board, wherein the plunger unit comprises:

a shaft extending through an opening formed in the gantry;

a biasing arrangement coupled to the shaft to apply the force to the package;

a foot at one end of the shaft to apply the force to the package; and a conformable pad disposable between the foot and the package.

7. A fixture comprising:

a base member;

a holder to retain a circuit board in a selected position relative to the base member;

a riser extending from the base member;

a gantry movably mounted to the riser above the base member; and a plunger unit mounted to the gantry to apply a substantially uniform force over substantially the entire extent of a package containing an integrated circuit to cause a plurality of contact pins of the integrated circuit to electrically contact corresponding conductive pads formed on the circuit board.

8. The fixture of claim 7, wherein the plunger unit comprises:

a shaft extending through an opening formed in the gantry; and a spring coupled to the shaft to cause the shaft to apply the force to the package.

9. The fixture of claim 8, further comprising an adjustment mechanism to select an amount of the force to be applied to the package.

10. The fixture of claim 9, wherein the adjustment mechanism comprises at least one of:

an adjustment fitting mounted on the shaft on a side of the gantry opposite to the spring, the adjustment fitting being positioned along the shaft to select the amount of the force applied by the spring;

at least one spacer disposed on the shaft and coupled to the spring to select the amount of the force to be applied to the package; and the spring being selected to have a predetermined spring constant.

11. The fixture of claim 7, wherein the gantry is positionable on the riser to locate the plunger unit at a selected location.

12. The fixture of claim 7, wherein the riser is positionable at different locations on the base member.

13. A method of coupling an integrated circuit to a circuit board, comprising:

aligning a plurality of pins of the integrated circuit with corresponding conductive pads on a circuit board; and positioning a clamp assembly to apply a substantially uniform force over substantially the entire extent of a package containing the integrated circuit to cause each of the plurality of pins of the integrated circuit to remain in electrical contact with a corresponding one of the conductive pads on the circuit board.

14. The method of claim 13, wherein positioning the clamp assembly comprises positioning a gantry to couple a plunger unit to the package when the plurality of pins of the integrated circuit are aligned with the corresponding conductive pads on the circuit board.

15. The method of claim 13, further comprising coupling a plunger unit to the package to apply the force.

16. The method of claim 15, further comprising selecting an amount of the force to be applied to the package.

17. The fixture of claim 1, wherein the holder comprises a plurality of clips and wherein each of the plurality of clips is positionable at different locations on the base member and is adjustable to accommodate different sizes and shapes of circuit boards.

18. The fixture of claim 1 wherein the riser is positionable at different locations on the base member.

19. The fixture of claim 1 wherein the gantry is positionable on the riser to locate the plunger unit at different locations.

20. The fixture of claim 1 further comprising a gantry positioning element to position the plunger unit at a selected location.

21. The fixture of claim 20 wherein the gantry positioning element comprises:

a gantry positioning knob;

a stem extending from the gantry positioning knob and extending through a slot formed in the gantry, the stem including a threaded end received by a matingly threaded opening formed in the riser, wherein the gantry is slidable along the slot and rotatable about the stem to position the plunger unit at the selected location radially and circumferentially relative to the riser and wherein the gantry positioning knob is tightened to retain the plunger unit in the selected position.

22. The fixture of claim 2 wherein the holder comprises a plurality of clips and wherein each of the plurality of clips is positionable at different locations on the base member and is adjustable to accommodate different sizes and shapes of circuit boards.

23. The fixture of claim 2 wherein the riser is positionable at different locations on the base member.

24. The fixture of claim 2 wherein the gantry is positionable on the riser to locate the plunger unit at different locations.

25. The fixture of claim 2 further comprising a gantry positioning element to position the plunger unit at a selected location.

26. The fixture of claim 25 wherein the gantry positioning element comprises:

a gantry positioning knob;

a stem extending from the gantry positioning knob and extending through a slot formed in the gantry, the stem including a threaded end received by a matingly threaded opening formed in the riser, wherein the gantry is slidable along the slot and rotatable about the stem to position the plunger unit at the selected location radially and circumferentially relative to the riser and wherein the gantry positioning knob is tightened to retain the plunger unit in the selected position.

27. The fixture of claim 3 wherein the holder comprises a plurality of clips and wherein each of the plurality of clips is positionable at different locations on the base member and is adjustable to accommodate different sizes and shapes of circuit boards.

28. The fixture of claim 3 wherein the riser is positionable at different locations on the base member.

29. The fixture of claim 3 wherein the gantry is positionable on the riser to locate the plunger unit at different locations.

30. The fixture of claim 3 further comprising a gantry positioning element to position the plunger unit at a selected location.

31. The fixture of claim 30 wherein the gantry positioning element comprises:

a gantry positioning knob;

a stem extending from the gantry positioning knob and extending through a slot formed in the gantry, the stem including a threaded end received by a matingly threaded opening formed in the riser, wherein the gantry is slidable along the slot and rotatable about the stem to position the plunger unit at the selected location radially and circumferentially relative to the riser and wherein the gantry positioning knob is tightened to retain the plunger unit in the selected position.

32. The fixture of claim 3 wherein the holder comprises a plurality of clips and wherein each of the plurality of clips is positionable at different locations on the base member and is adjustable to accommodate different sizes and shapes of circuit boards.

33. The fixture of claim 6 wherein the riser is positionable at different locations on the base member.

34. The fixture of claim 6 wherein the biasing arrangement comprises a coil spring selected to have a predetermined spring constant.

35. The fixture of claim 6 wherein the gantry is positionable on the riser to locate the plunger unit at different locations.

36. The fixture of claim 6 further comprising a gantry positioning element to position the plunger unit at a selected location.

37. The fixture of claim 36 wherein the gantry positioning element comprises:

a gantry positioning knob;

a stem extending from the gantry positioning knob and extending through a slot formed in the gantry, the stem including a threaded end received by a matingly threaded opening formed in the riser, wherein the gantry is slidable along the slot and rotatable about the stem to position the plunger unit at the selected location radially and circumferentially relative to the riser and wherein the gantry positioning knob is tightened to retain the plunger unit in the selected position.

38. The fixture of claim 7 wherein the plunger unit includes a foot about the same size and shape as the package.

39. The fixture of claim 38 further comprising a conformable pad disposed between the foot and the package.

40. The fixture of claim 39 further comprising an adhesive to attach the pad to the foot.

41. The fixture of claim 7 wherein the holder is coupled directly to the base so as to hold the circuit board is a fixed position.

42. The fixture of claim 41 wherein the holders comprise a plurality a clips to slidably contact a surface of the base.

43. The fixture of claim 41 wherein the clips are adapted to capture edges of the circuit board.

44. The method of claim 13 further comprising applying the uniform force through a foot about the same size and shape as the package.

45. The method of claim 13 further comprising applying the uniform force through a confirmable pad directly to the package.

46. The method of claim 45 where the pad adheres to the foot.

47. The method of claim 13 further comprising holding the circuit board directly to the base without motion in a horizontal direction.

48. The method of claim 47 wherein holding the board comprises:

sliding a plurality of clips across a surface of a base to engage the board; and screwing the clips to the base so as to prevent further movement of the board.

49. The method of claim 47 wherein holding the board further comprises capturing its edges in the clips so as to prevent vertical movement.

50. The method of claim 13 further comprising testing the integrated circuit while it is being held to the circuit board.

51. The method of claim 50 wherein terminals in the integrated circuit electrically contact conductive pads on the circuit board.

* * * * *

UNITED STATES PATENT AND TRADEMARK OFFICE
CERTIFICATE OF CORRECTION

PATENT NO. : 6,631,556 B2
DATED : October 14, 2003
INVENTOR(S) : Ken K. Lee

It is certified that error appears in the above-identified patent and that said Letters Patent is hereby corrected as shown below:

<u>Column 10,</u>
Line 6, delete "is" after "board" and insert -- in -- therefor.
Line 9, delete "a" after "plurality" and insert -- of -- therefor.
Line 17, delete "confirmable" and insert -- conformable -- therefor.

Signed and Sealed this

Sixteenth Day of March, 2004

JON W. DUDAS
*Acting Director of the United States Patent and Trademark Office*